(12) United States Patent
Holzmann

(10) Patent No.: US 11,990,870 B2
(45) Date of Patent: May 21, 2024

(54) SWITCHED RESISTOR FOR SWITCHED DRIVER STAGE FEEDBACK LOOP

(71) Applicant: Nuvoton Technology Corporation, Taiwan (CN)

(72) Inventor: Peter J. Holzmann, San Jose, CA (US)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 338 days.

(21) Appl. No.: 17/687,679

(22) Filed: Mar. 7, 2022

(65) Prior Publication Data
US 2023/0283235 A1 Sep. 7, 2023

(51) Int. Cl.
*H03F 3/38* (2006.01)
*H03F 1/02* (2006.01)
*H03F 3/217* (2006.01)

(52) U.S. Cl.
CPC .......... *H03F 1/0205* (2013.01); *H03F 3/217* (2013.01); *H03F 2200/03* (2013.01)

(58) Field of Classification Search
CPC ..... H03F 1/0205; H03F 3/217; H03F 2200/03
USPC .......................................... 381/121; 330/251
See application file for complete search history.

(56) References Cited

U.S. PATENT DOCUMENTS

| | | | | |
|---|---|---|---|---|
| 4,885,517 A * | 12/1989 | Pennock | ................. | H03F 1/305 180/443 |
| 6,763,114 B1 * | 7/2004 | Nalbant | .................... | H03F 3/68 330/10 |
| 7,142,050 B2 * | 11/2006 | Risbo | ....................... | H03F 3/38 330/10 |
| 10,224,804 B1 * | 3/2019 | Hsing | ............... | H02M 7/53875 |
| 10,429,867 B1 * | 10/2019 | Kim | ....................... | G05F 1/575 |
| 11,489,498 B1 * | 11/2022 | Prakash | ............... | H03F 3/2171 |
| 2005/0245382 A1 * | 11/2005 | Iwahashi | .................. | C03C 3/06 501/54 |
| 2010/0194463 A1 * | 8/2010 | Moon | ................ | H03K 17/0822 327/427 |
| 2013/0021183 A1 * | 1/2013 | Ashburn, Jr. | ......... | H03M 3/368 341/143 |
| 2015/0236648 A1 * | 8/2015 | Ahmad | ............... | H03F 3/45977 330/84 |
| 2016/0079931 A1 * | 3/2016 | Tsai | .................... | H03F 3/45475 330/256 |
| 2016/0373076 A1 * | 12/2016 | Buono | .................. | H03F 3/2173 |
| 2018/0020288 A1 * | 1/2018 | Risbo | ...................... | H03F 3/185 |
| 2018/0351523 A1 * | 12/2018 | Lesso | .................. | H03G 3/3089 |
| 2021/0391702 A1 * | 12/2021 | Yang | ....................... | H02H 9/02 |
| 2022/0202890 A1 * | 6/2022 | Xu | ............................ | A61P 1/16 |

* cited by examiner

*Primary Examiner* — William J Deane, Jr.
(74) *Attorney, Agent, or Firm* — Kilpatrick Townsend & Stockton LLP

(57) ABSTRACT

A class-D driver circuit includes a feedback loop including an input integrator stage, a switched modulator, and an output driver stage. A feedback resistor connects an output terminal of the output driver stage with an input node of the input integrator stage to provide a feedback current. The class-D driver circuit also includes a compensation circuit configured to provide a compensation current to an output node of the input integrator stage to relieve a slew rate limitation of the feedback loop, the compensation current having a magnitude based on the magnitude of the feedback current.

20 Claims, 10 Drawing Sheets

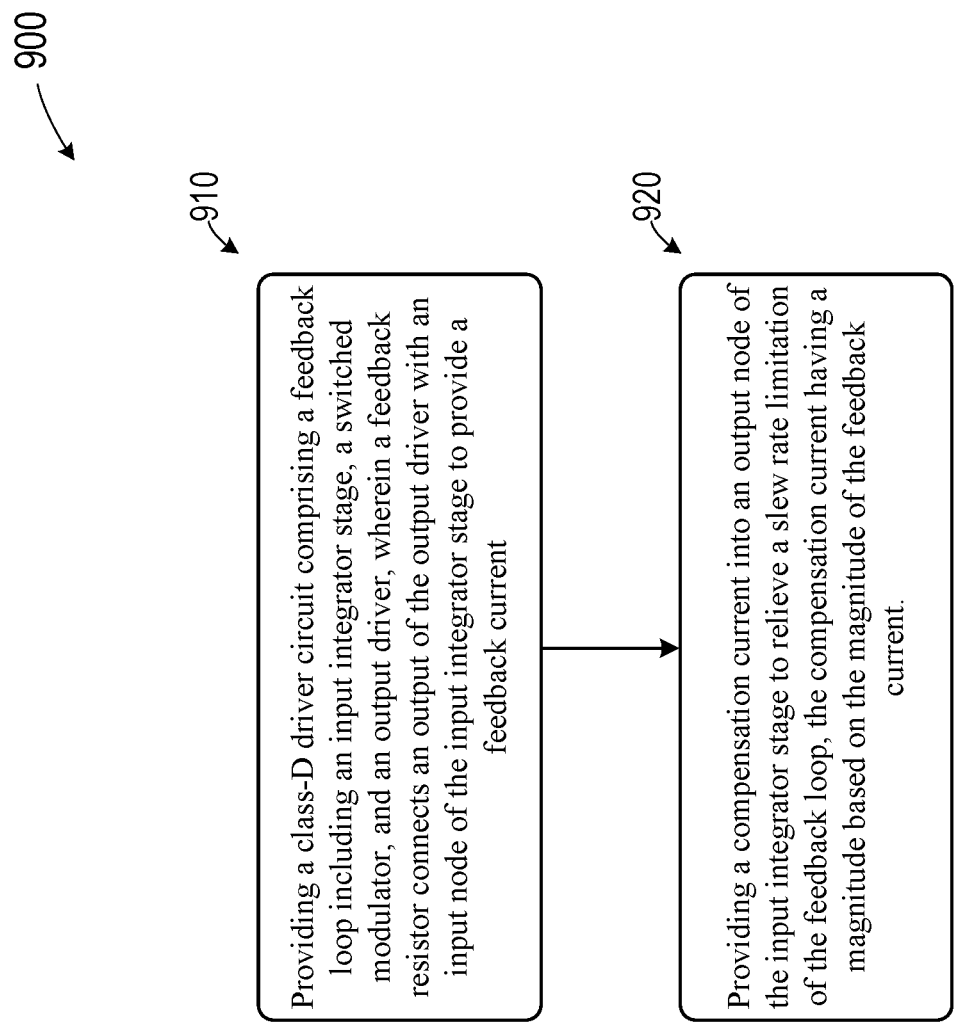

SWITCHED RESISTOR FOR SWITCHED DRIVER STAGE FEEDBACK LOOP

BACKGROUND OF THE INVENTION

This invention relates to the field of electronic circuits in audio systems. More particularly, the present invention relates to efficient switched drivers for audio applications. Embodiments of the invention can also be applied to other circuits, such as efficient switched power conversion circuits.

A class-D amplifier, also known as a switching amplifier, is an electronic amplifier in which transistors operate as binary switches. They are either fully on or fully off. CLASS-D amplifiers employ rail-to-rail output switching, where, ideally, their output transistors virtually always carry either zero current or zero voltage. Thus, their power dissipation is minimal, and they provide high efficiency over a wide range of power levels. Their advantageous high efficiency has propelled their use in various audio applications, from cell phones to flat screen televisions and home theater receivers. Class-D audio power amplifiers are more efficient than class-AB audio power amplifiers. Because of their greater efficiency, class-D amplifiers require smaller power supplies and eliminate heat sinks, significantly reducing overall system costs, size and weight.

Class D audio power amplifiers convert audio signals into high-frequency pulses that switch the output in accordance with the audio input signal. Some class D amplifiers use pulse width modulators (PWM) to generate a series of conditioning pulses that vary in width with the audio signal's amplitude. The varying-width pulses switch the power-output transistors at a fixed frequency. Other class D amplifiers may rely upon other types of pulse modulators. The following discussion will mainly refer to pulse width modulators, but those skilled in the art will recognize that class D amplifiers may be configured with other types of modulators.

FIG. 1A is a simplified schematic diagram illustrating a conventional class-D amplifier. As shown in FIG. 1A, class-D amplifier 100 is a differential amplifier. The differential input audio signals INP and INM are input to comparators 101 and 102, where input signals INP and INM are compared triangular waves VREF generated from an oscillator 103 to generate PWM signals 106 and 107. PWM signals 106 and 107 are coupled to the gates of transistors M1, M2, M3, and M4, respectively. Differential output signals $V_{OUTM}$ and $V_{OUTP}$ of the class D amplifier are respectively provided at terminals labeled OUTM and OUTP. As shown in FIG. 1A, output signals OUTM and OUTP are connected to a speaker load 110, which is represented by an inductor L1 and a resistor R1.

FIG. 1B is a waveform diagram illustrating the modulation of signals in the class-D amplifier of FIG. 1A. As shown in FIG. 1B, differential input signals, e.g., audio signals INM and INP, are compared with a triangular reference waveform by two comparators as described above in connection with FIG. 1A. The output signals of the comparators are pulse signals at a fixed frequency whose pulse width is proportional to the input signal. Two PWM signals are shown in FIG. 1B as OUTP and OUTM.

Switched drivers, or class-D drivers, often include a feedback loop for noise reduction and improved stability. As explained in more detail below, these class-D amplifiers tend to have limitations in slew rate for high frequency switching applications.

BRIEF SUMMARY OF THE INVENTION

The inventor has observed class-D amplifiers with a feedback loop typically include a filter, and the first stage of the filter is usually an integrator to receive the feedback signal from the driver stage. In order to operate at high switching speed, the integrator needs to meet high speed settling time requirement. The high-speed design can be complicated. Embodiments of the invention address the slew rate limitation of the first integrator of the switched driver by providing a compensation current at an output of the integrator, without having to modify the design of the integrator to provide higher slew rate.

Embodiments of the invention address the slew rate limitation of the first integrator of the switched driver by providing a compensation current at an output of the integrator, without having to modify the design of the integrator to provide higher slew rate.

According to some embodiments of the present invention, a class-D driver circuit includes an input terminal; an output terminal; an input integrator stage having an amplifier with an input node and an output node, the input node coupled to the input terminal through an input resistor to receive an input signal; a feedback path coupling the input node to the output terminal through a feedback resistor and an integration capacitor to receive a feedback current, the integration capacitor coupled between the input node and the output node of the amplifier, the input integrator stage configured to produce a filtered input signal at the output node; a switched modulator stage coupled to the input integrator stage and configured for receiving the filtered input signal from the input integrator stage and generating a control signal; an output driver stage coupled to the switched modulator stage and configured to receive the control signal for driving an output transistor and to provide an output signal at the output terminal; and a compensation circuit including an inverter and a switched resistor coupled between the output terminal of the class-D driver circuit and the output node of the input integrator stage, wherein the compensation circuit is configured to provide a compensation current whose magnitude matches the magnitude of the feedback current.

In some embodiments of the above class-D driver circuit, the compensation current is determined by Vref/Rsw, wherein Vref is a power supply voltage to the inverter in the compensation circuit, and Rsw is the resistance of the switched resistor. The feedback current is determined by Vdd/Rfb, wherein Vdd is a power supply voltage to the class-D driver circuit, and Rfb is the resistance of the feedback resistor and Vref/Rsw=Vdd/Rfb. A feedback current of +Vdd/Rfb is associated with a compensation current of −Vref/Rsw or −Vdd/Rfb. A feedback current of −Vdd/Rfb is associated with a compensation current of +Vref/Rsw or +Vdd/Rfb.

In some embodiments, the compensation circuit is configured to reduce total harmonic distortion (THD) when the class-D driver circuit operates at a higher speed than its designed slew rate.

In some embodiments, the switched modulator stage comprises a class-D PWM (pulse width modulation) modulator stage.

In some embodiments, the switched modulator stage comprises a class-D PFM (pulse frequency modulation) modulator stage.

According to some embodiments of the present invention, a class-D driver circuit includes a feedback loop including an input integrator stage, a switched modulator, and an output driver stage, wherein a feedback resistor connects an output terminal of the output driver stage with an input node of the input integrator stage to provide a feedback current. The class-D driver circuit also includes a compensation circuit including an inverter and a switched resistor connecting the output terminal of the output driver stage with an output node of the input integrator stage, the compensation circuit configured to provide a compensation current having a magnitude based on the magnitude of the feedback current.

In some embodiments of the above class-D driver circuit, the compensation current is determined by Vref/Rsw, wherein Vref is a power supply voltage to the inverter in the compensation circuit, and Rsw is the resistance of the switched resistor; the feedback current is determined by Vdd/Rfb, wherein Vdd is a power supply voltage to the class-D driver circuit, and Rfb is the resistance of the feedback resistor; and Vref/Rsw=Vdd/Rfb. A feedback current of +Vdd/Rfb is associated with a compensation current of −Vref/Rsw or −Vdd/Rfb. A feedback current of −Vdd/Rfb is associated with a compensation current of +Vref/Rsw or +Vdd/Rfb.

In some embodiments, the compensation circuit is configured to reduce total harmonic distortion (THD) when the class-D driver circuit operates at a higher speed than its designed slew rate.

In some embodiments, the input integrator stage further comprises an integration capacitor coupled between the input node and the output node of the input integrator stage.

In some embodiments, the class-D driver circuit is configured as a single ended driver circuit. In other embodiments, the class-D driver circuit is configured as a differential driver circuit.

In some embodiments, wherein the class-D driver circuit is a differential class-D driver circuit, including differential input terminals for receiving differential input signals, differential output terminals for providing differential output signals which are connected to a load device, a differential input integrator stage, a differential PWM modulator stage, and a differential output driver stage.

In some embodiments of the above differential class-D driver circuit, the feedback loop includes a first feedback loop and a second feedback loop for providing a first feedback current and a second feedback current, respectively. Moreover, the compensation circuit includes a first compensation circuit and a second compensation circuit configured to provide a first compensation current and a second compensation current to differential output nodes of the differential input integrator stage.

In some embodiments, an audio system includes the class-D driver circuit described above and a speaker coupled to the class-D driver circuit to receive an output signal from the output driver stage.

According to some embodiments of the present invention, a method includes providing a class-D driver circuit having a feedback loop including an input integrator stage, a switched modulator, and an output driver, wherein a feedback resistor connects an output of the output driver with an input node of the input integrator stage to provide a feedback current. The method also includes providing a compensation current into an output node of the input integrator stage to relieve a slew rate limitation of the feedback loop, the compensation current having a magnitude based on the magnitude of the feedback current.

In some embodiments of the above method, the compensation circuit includes an inverting buffer and a switched resistor connecting the output of the output driver with an output node of the input integrator stage.

In some embodiments of the above method, the compensation current is determined by Vref/Rsw, wherein Vref is a power supply voltage to the inverter in the compensation circuit, and Rsw is the resistance of the switched resistor. The feedback current is determined by Vdd/Rfb, wherein Vdd is a power supply voltage to the class-D driver circuit, and Rfb is the resistance of the feedback resistor, and Vref/Rsw=Vdd/Rfb. A feedback current of +Vdd/Rfb is associated with a compensation current of −Vref/Rsw or −Vdd/Rfb. A feedback current of −Vdd/Rfb is associated with a compensation current of +Vref/Rsw or +Vdd/Rfb.

In some embodiments of the above method, the compensation circuit is configured to reduce total harmonic distortion (THD) when the class-D driver circuit operates at a higher speed than its designed slew rate.

In some embodiments of the above method, the switched modulator stage comprises a class-D PFM (pulse frequency modulation) modulator stage.

In some embodiments of the above method, the switched modulator stage comprises a class-D PFM (pulse frequency modulation) modulator stage.

In some embodiments of the above method, the input integrator stage further comprises an integration capacitor coupled between the input node and the output node of the input integrator stage.

Various additional objects, features, and advantages of the present invention can be more fully appreciated with reference to the detailed description and accompanying drawings that follow.

BRIEF DESCRIPTION OF THE DRAWINGS

FIG. 9 is a simplified flowchart illustrating a method according to some embodiments of the present invention.

DETAILED DESCRIPTION OF THE INVENTION

Figure 1A:
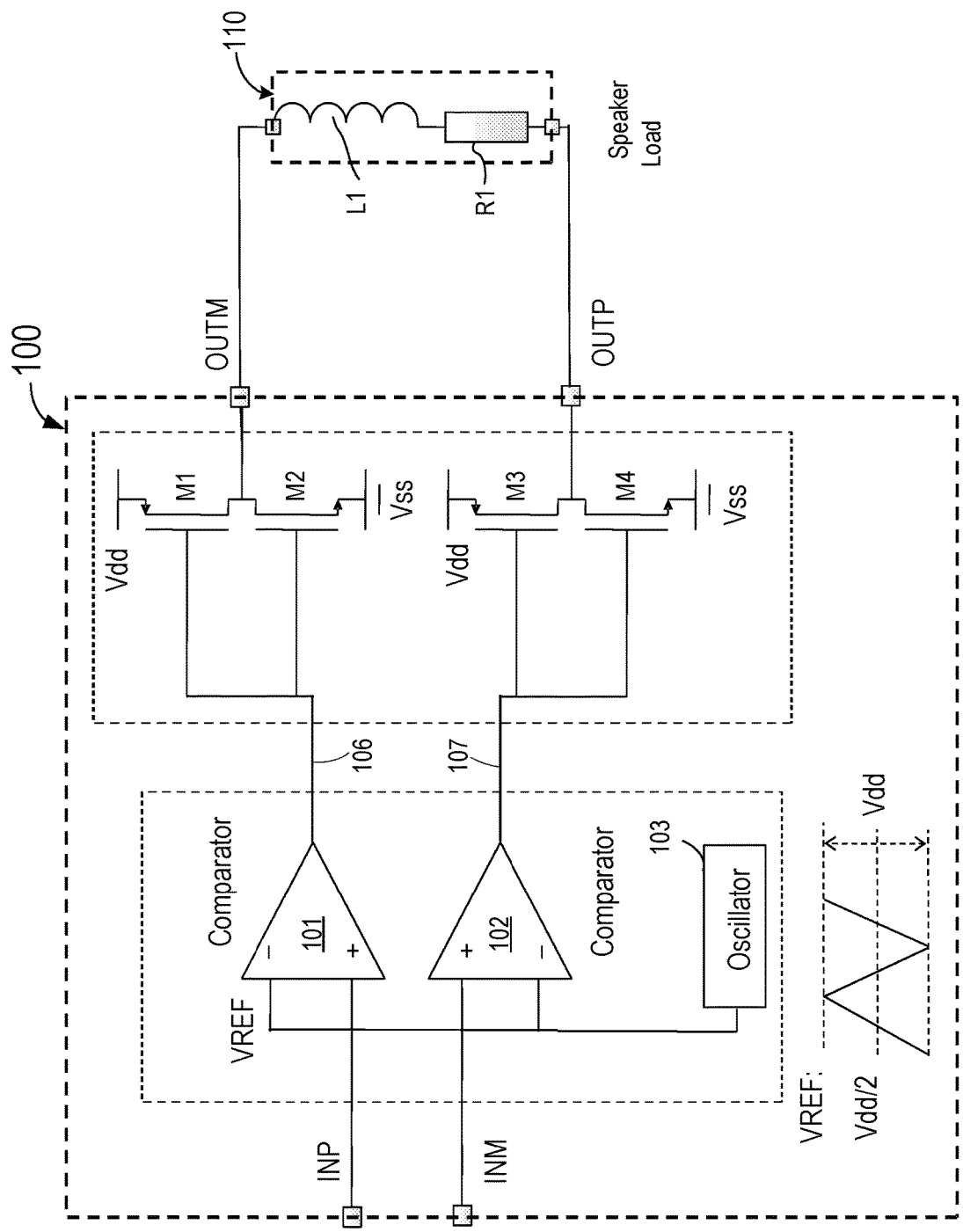
FIG. 1A is a simplified schematic diagram illustrating a conventional class-D amplifier.
Figure 1B:
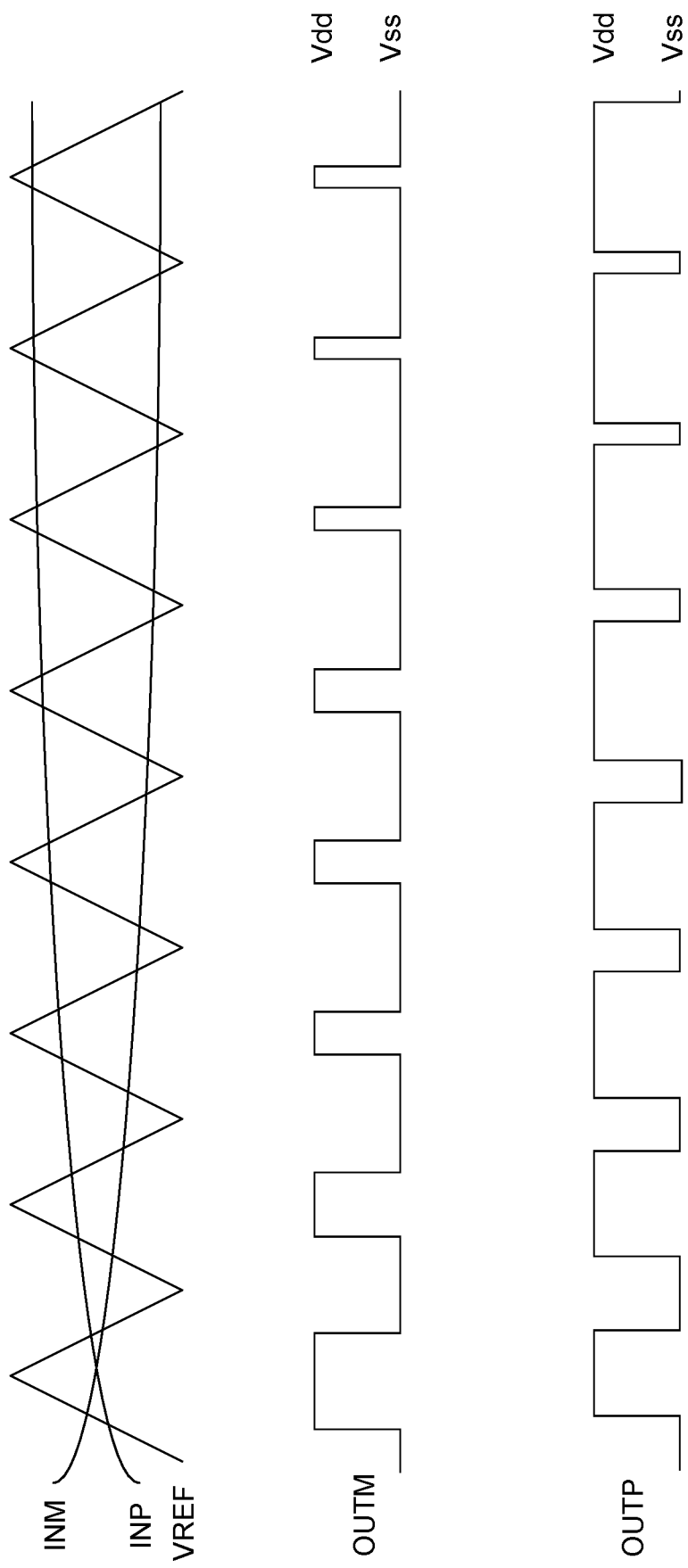
FIG. 1B is a waveform diagram illustrating the modulation of signals in the class-D amplifier of FIG. 1A.

Conventional Class-D amplifiers such as the class-D amplifier shown in FIG. 1 are susceptible to distortions and noises from the circuit elements and downstream components. In addition, noise, ripple, and variations in the power supply voltage biasing the downstream switching stage will also introduce errors in the output signal. Therefore, feedback control is used to compensate for many of these non-ideal effects.

Figure 2:
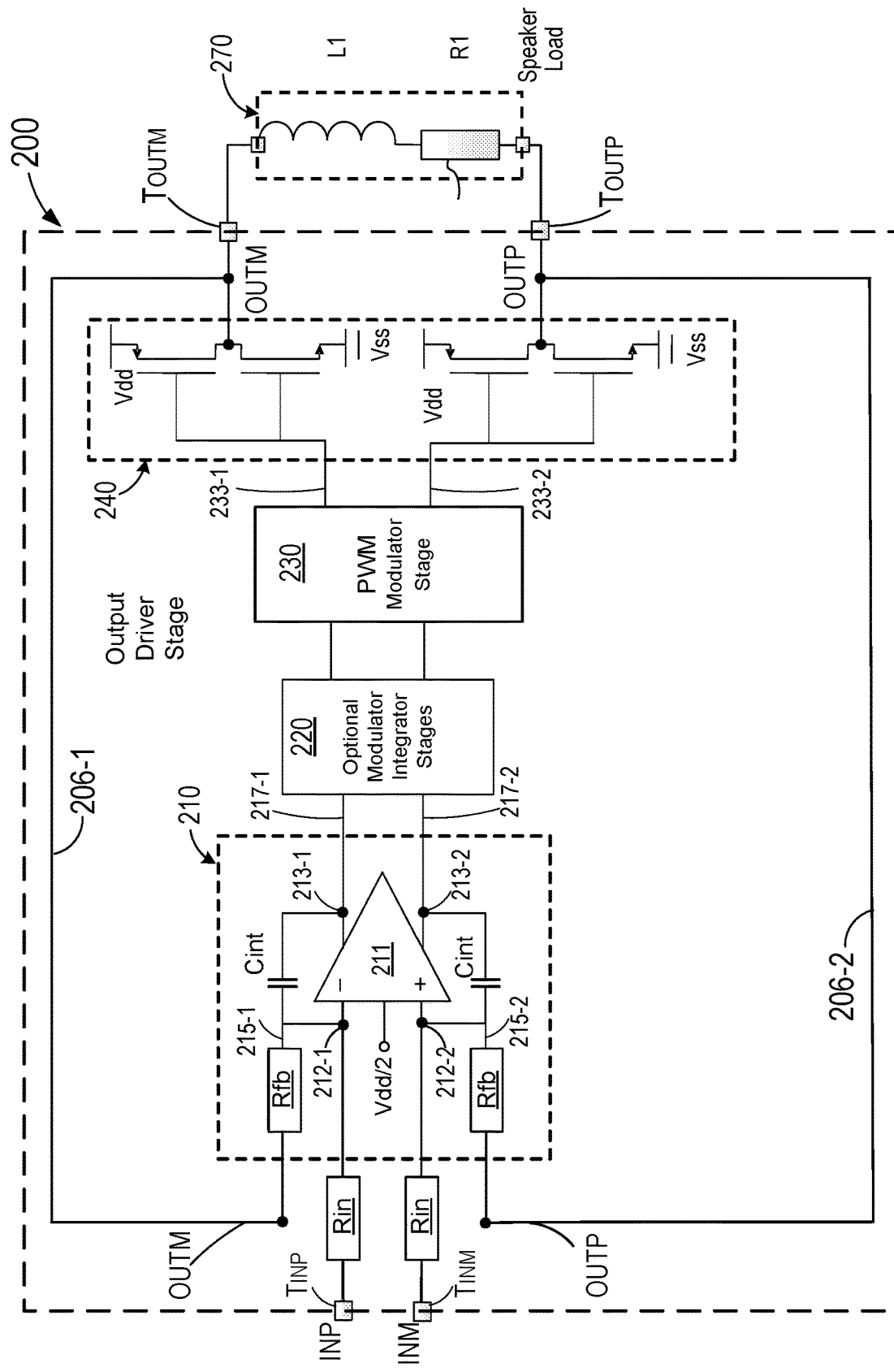
FIG. 2 is a simplified schematic diagram illustrating a conventional Class-D amplifier with a feedback loop.

FIG. 2 is a simplified schematic diagram illustrating a conventional Class-D amplifier with a feedback loop. As shown in FIG. 2, Class-D driver circuit 200 has a differential input integrator 210, optional modulator integrator stages 220, a PWM modulator stage 230, and an output driver stage 240. Class D driver circuit 200 is shown as a differential amplifier. As shown in FIG. 2, output signals OUTM and OUTP are connected to a speaker load 270, which is represented by an inductor L1 and a resistor R1.

As shown in FIG. 2, class D driver circuit 200 also includes input terminals TINP and TINM, and output terminals TOUTP and TOUTM. Input integrator stage 210 includes an amplifier 211 with input nodes 212-1 and 212-2 and output nodes 213-1 and 213-2, the input node 212-1 and 212-2 coupled to the input terminal TINP and TINM through an input resistor Rin to receive an input signal INP and INM. Feedback paths 206-1 and 206-2 couple the input nodes 212-1 and 212-2 to the output terminals TOUTP and TOUTM through feedback resistors Rfb to receive feedback signals 215-1 and 215-2. The input integrator stage 210 is configured to produce filtered input signals 217-1 and 217-2 at the output nodes 213-1 and 213-2.

In class D driver circuit 200, a class-D PWM (pulse width modulation) modulator stage 230 is coupled to the input integrator stage 210 and configured for receiving the filtered input signals 217-1 and 217-2 from the input integrator stage 210 and generating PWM signals 233-1 and 233-2. An output driver stage 240 is coupled to the class-D PWM modulator stage 230 and is configured to receive the PWM signals 233-1 and 233-2 for driving CMOS (metal oxide semiconductor) output transistors and to provide an output signal OUTM and OUTP at the output terminals TOUTM and TOUTP.

The differential input integrator stage 210 receives the input signals INP and INM through the input resistors Rin, and also receives feedback signals from OUTM and OUTP through the feedback resistors Rfb. Since OUTP and OUTM are switching between power supply voltages Vdd and Vss at a fast switching rate, the fast switching currents through the feedback resistor Rfb will need to be supplied through the outputs of amplifier 211 and the integrator capacitors Cint. This is in order to keep the amplifier input terminals at the same voltage and to keep the output terminals close to Vdd/2. Since the amplifier is part of a feedback loop and the subsequent stages provide finite signal gain, the amplifier 211 output signals remain relatively small and close to the common mode voltage Vdd/2 during operation. The modulator is designed such that the dominant pole of the feedback loop is determined by the first integrator stage and such that the time constant is tc≈Rfb×Cint.

At the same time the modulator in-band output noise is greatly determined by the input amplifier, with resistors Rfb and Rin, since the noise from the subsequent stages is suppressed by the loop gain. The noise power contribution of Rfb is: 4kT×Rfb, where k is the Boltzmann constant and T is the temperature. In order to reduce the modulator output noise, the value of Rfb can be reduced. However, in order to keep the same time constant, Cint will need to increase. For a lower value of Rfb, the fast current transitions at the amplifier outputs will be even larger, requiring a higher amplifier DC bias. This requires larger output devices and therefore will also impact the amplifier miller capacitor and input stage design, which is highly undesired. Therefore, an improved solution is desired.

Figure 3:
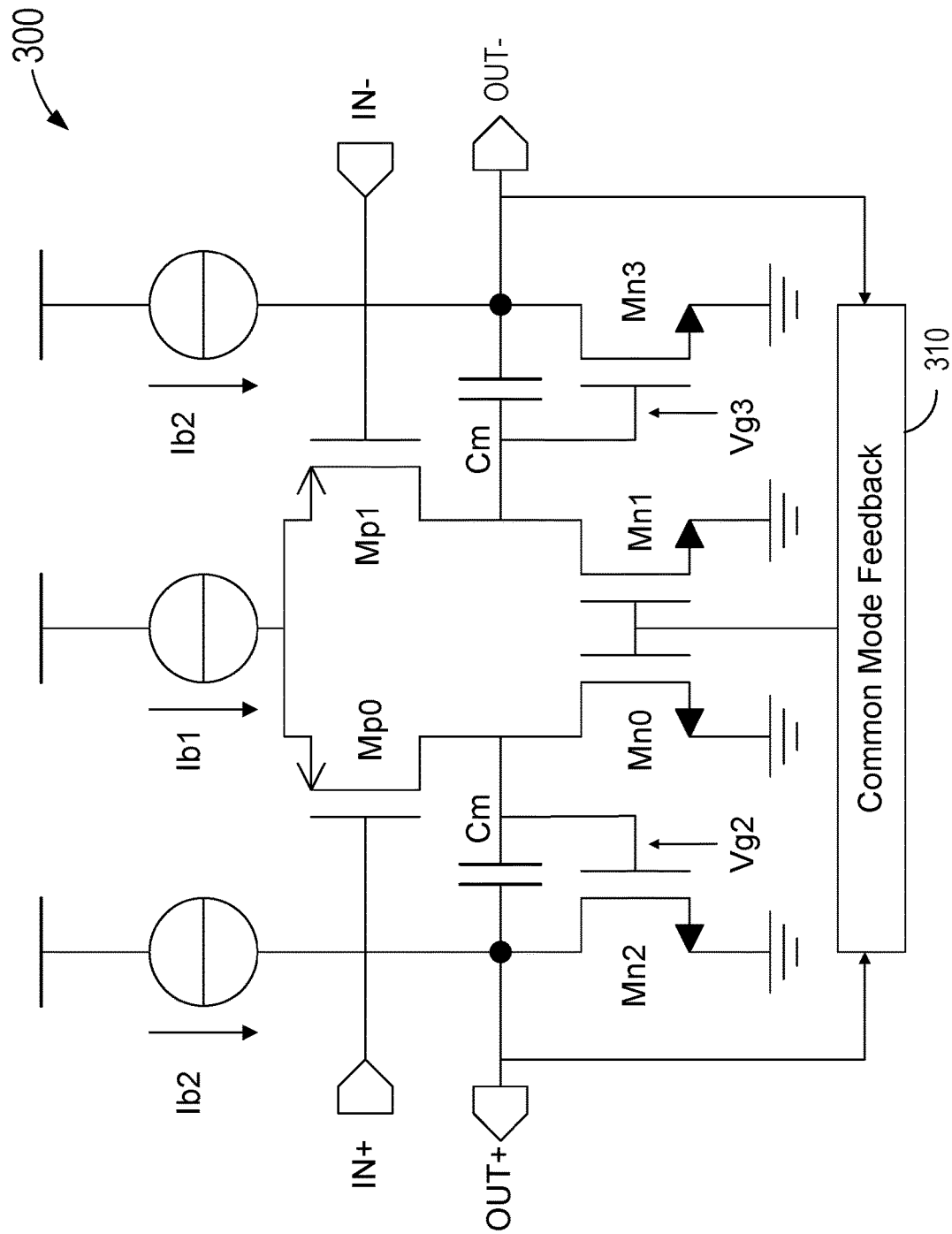
FIG. 3 is a simplified schematic diagram illustrating an exemplary integrator amplifier according to some embodiments of the present invention.

FIG. 3 is a simplified schematic diagram illustrating an exemplary integrator amplifier according to some embodiments of the present invention. As shown in FIG. 3, integrator amplifier 300 is an example that can be used as integrator amplifier 211 in Class-D amplifier stage 200 in FIG. 2. The differential inputs IN+ and IN− are tied to differential pair transistors Mp0 and Mp1 biased by a current source Ib1. Transistors Mp0 and Mp1 have the same dimensions and therefore their bias currents are (Ib1)/2. They are part of the first stage of the amplifier together with transistors Mn0 and Mn1. The gates of transistors Mn0 and Mn1 are biased by a common mode feedback circuit 310, which forces the common mode output on OUT+ and OUT− to Vdd/2. The transistors Mn0 and Mn1 have the same dimensions and therefore the resulting bias current for each is (Ib1)/2. The outputs of the first stage are connected to the gates of Mn2 and Mn3, which are the amplifier second stage. Mn2 and Mn3 are equal devices biased up at Ib2. The two-stage amplifier includes a miller capacitor Cm to keep the amplifier stable in the feedback loop.

Referring back to FIG. 2, when the modulator outputs are switching, the feedback resistors Rfb will inject a delta current Vdd/Rfb into the amplifier input nodes. Considering that the input and output voltages remain constant for no error to occur in the modulator loop, this current is supplied by the source Ib2 and transistors Mn2 and Mn3. Looking at the output node OUT+ for instance, the current would result in a change of gate voltage of transistor Mn2 calculated as follows:

$$\Delta I = gm \times \Delta Vg = \frac{Vdd}{Rfb}$$

$$\Delta Vg = \frac{Vdd}{(gm \times Rfb)}.$$

Since the output voltage is considered to remain constant and Cm>>Cg,n2, the capacitance on the gate of Mn2 is dominated by Cm. The maximum current swing is about (Ib1)/2. The differential relation between the current and voltage during slewing is therefore:

$$\frac{Ib1}{2} = Cm \times \left(\frac{\Delta Vg}{\Delta t}\right)$$

$$\Delta t = \frac{2 \times Cm \times Vdd}{Ib1 \times gm \times Rfb}.$$

Therefore, when the feedback resistor Rfb becomes smaller, Δt becomes larger, and it takes longer for the amplifier to settle, resulting in a larger error in the modulator loop. It can be compensated for by increasing gm and/or Ib1, but this would increase the bias current and also affects the loop stability (because of the larger gain), which would then require a larger Cm, defeating such compensation.

Some embodiments of the invention provide a better solution that does not involve changes in the given amplifier design, by noting the fact that the delta currents injected into the inputs of the amplifier are known as +/−Vdd/Rfb. By injecting an opposite current into the output nodes of the amplifier, these currents no longer need to be supplied by the amplifier, and the amplifier feedback control and settling requirement are relaxed.

For instance, if OUTM switches from 0 to Vdd, the delta current into the negative input terminal of the input amplifier is the power supply voltage Vdd divided by the feedback resistor Rfb, or Vdd/Rfb. Some embodiments introduce a compensation current by coupling the OUTM signal to an inverter with a power supply of a voltage Vref in series with a switched resistor Rsw, and injecting an opposite delta current of −Vref/Rsw to the output of the integrator amplifier. Here, the magnitude of Vref/Rsw is substantially the same as the magnitude of Vdd/Rfb. In some embodiments, the magnitude of Vref is the same as Vdd, and the magnitude of switched resistor Rsw is the same as the magnitude of feedback resistor Rfb, such that both currents have the same absolute magnitude. However, the compensation network can be made flexible using different Vref and Rfb values to achieve the same goal.

Figure 4:
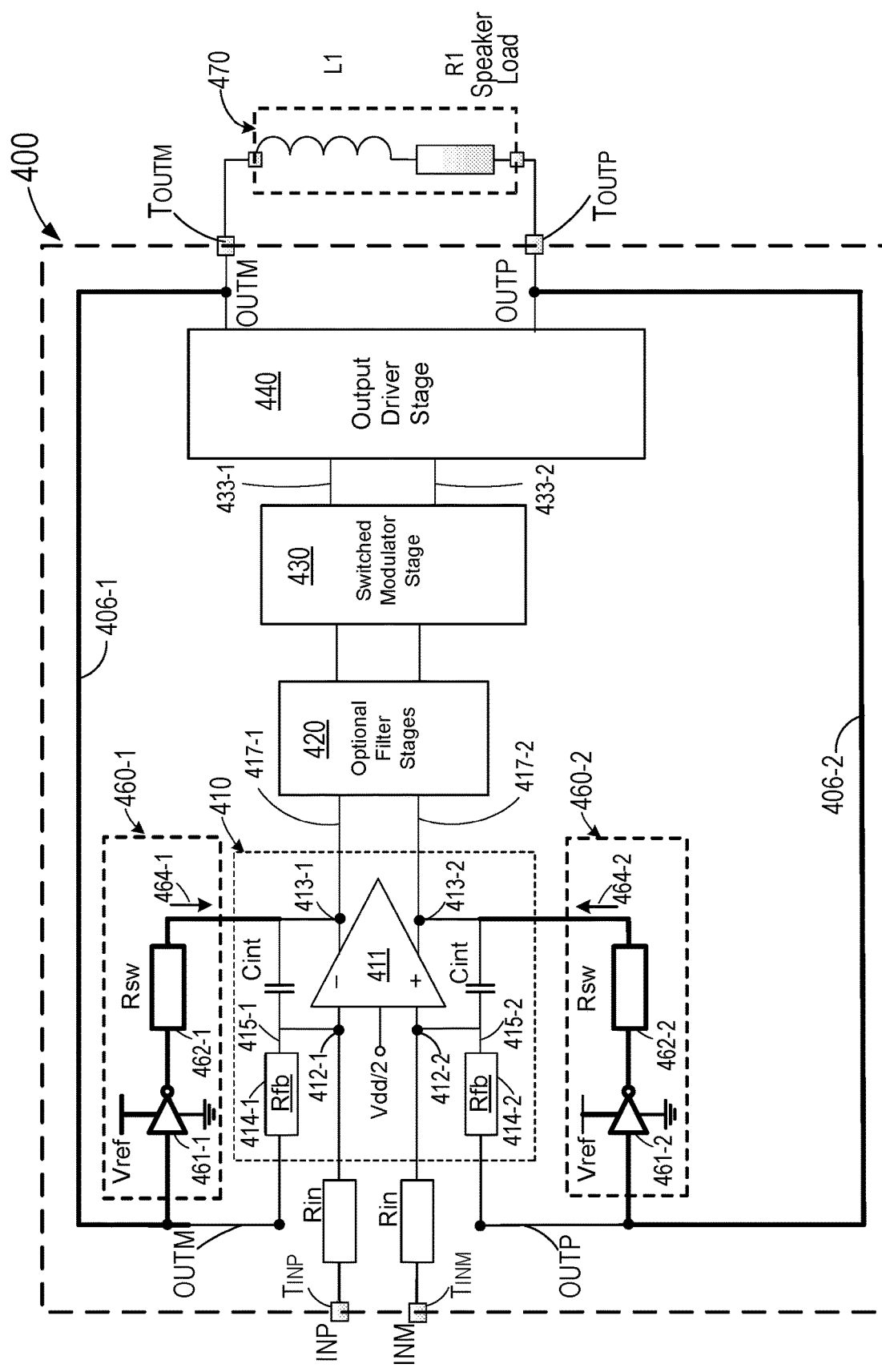
FIG. 4 is a simplified schematic diagram illustrating an implementation of a Class-D driver circuit with a feedback loop and a compensation circuit according to some embodiments of the present invention.

FIG. 4 is a simplified schematic diagram illustrating an implementation of a Class-D driver circuit with a feedback loop and a compensation circuit according to some embodiments of the present invention. As shown in FIG. 4, a class-D driver circuit 400 includes input terminals TINP and TINM for receiving differential input signals INP and INM. Differential output signals OUTM and OUTP of the class-D driver circuit are respectively provided at terminals labeled TOUTM and TOUTP. As shown in FIG. 4, output signals OUTM and OUTP are connected to a load device 470. In the example of FIG. 4, the load device 470 is a speaker load, which is represented by an inductor L1 and a resistor R1. In the example of FIG. 4, driver circuit 400 has a differential input integrator stage 410, optional modulator integrator stages 420, a PWM modulator stage 430, and an output driver stage 440. The optional modulator integrator stages 420 can be one or more stages, depending on the order of the modulator loop.

In alternative embodiments, the class-D driver circuit can be a single-ended circuit, with an input terminal TIN receiving an input signal IN and an output terminal TOUT providing an output signal OUT (not shown). The description below is based on a differential driver 400. However, it is understood that the description is applicable to a single-ended circuit as well.

As shown in FIG. 4, class-D driver circuit 400 includes an input integrator stage 410 having an amplifier 411 with input nodes 412-1 and 412-2 and output nodes 413-1 and 413-2. The input nodes 412-1 and 412-2 are coupled to input terminals TINP and TINM through input resistors Rin to receive an input signal INP and INM, respectively. Class-D driver circuit 400 also includes feedback paths 406-1 and 406-2 coupling the output terminal TOUTP and TOUTM to the input nodes 412-1 and 412-2 through feedback resistors Rfb (414-1 and 414-2) to provide feedback currents 415-1 and 415-2. The input integrator stage 410 is configured to produce filtered input signals 417-1 and 417-2 at the output nodes 413-1 and 413-2 of input integrator stage 410.

In general, the feedback paths can include a filter circuit to receive a feedback signal. The input integrator stage 410 is a form of first-order low-pass filter, including the amplifier 411, such as an operational amplifier, and an RC circuit formed by feedback resistor Rfb and integrator capacitor Cint. Depending on the implementation, there can be additional optional filter stages 410.

Class-D driver circuit 400 includes a switched modulator stage 430 coupled to the input integrator stage 410 and configured for receiving the filtered input signals 417-1 and 417-2 from the input integrator stage 410 and generating differential switching driving signals 433-1 and 433-2. In an example, switched modulator stage 430 is a class-D PWM (pulse width modulation) modulator stage coupled to the input integrator stage 410 and configured for receiving the filtered input signals 417-1 and 417-2 from the input integrator stage 410 and generating PWM signals 433-1 and 433-2. An example of the class-D PWM modulator stage is illustrated in FIG. 1, in which the differential input signals INP and INM are input to comparators 101 and 102, where input signals INP and INM are compared triangular waves VREF generated from an oscillator 103 to generate PWM signals 106 and 107. In other examples, switched modulator stage 430 can be a PFM (pulse frequency modulation) modulator stage, or another suitable switched modulator stage.

Class-D driver circuit 400 also includes an output driver stage 440 coupled to switched modulator stage 430 and configured to receive switching driving signal 433-1 and 433-2 for driving an output device to provide an output signal OUTM and OUTP at the output terminal TOUTM and TOUTP. An example of an output stage is illustrated in FIG. 1, in which MOS (metal oxide semiconductor) output transistors M1, M2, M3, and M4 are configured as CMOS differential output drivers to provide an output signal OUTM and OUTP at the output terminal TOUTM and TOUTP.

As shown in FIG. 4, class-D driver circuit 400 also includes a compensation circuit including an inverter and a switched resistor coupled between the output terminal of the class D driver circuit and the output node of the input integrator stage. As shown in FIG. 4, compensation circuit 460-1 include an inverter 461-1 and a switched resistor Rsw (462-1) coupled between the output terminal TOUTM of the class D driver circuit 400 and the output node 413-1 of the input integrator stage 410. Similarly, compensation circuits 460-2 includes an inverter 461-2 and a switched resistor Rsw (462-2) coupled between the output terminal TOUTP of the class D driver circuit 400 and the output node 413-2 of the input integrator stage 410. The compensation circuit 460-1 is configured to provide a compensation current 464-1, whose magnitude is equal to the feedback current 415-1. Similarly, the compensation circuit 460-2 is configured to provide a compensation current 464-2, whose magnitude is equal to the feedback current 415-2.

In the class-D driver circuit 400 in FIG. 4, the compensation currents 464-1 and 464-2 are determined by Vref/Rsw, wherein Vref is the power supply voltage to the inverter in the compensation circuit, and Rsw is the resistance of the switched resistors Rsw 462-1 and 462-1. The feedback currents 415-1 and 415-2 are determined by Vdd/Rfb, wherein Vdd is the power supply voltage to the class-D driver circuit, and Rfb is the resistance of the feedback resistors 414-1 and 414-2. In some embodiments, Vref and Rsw are selected such that Vref/Rsw=Vdd/Rfb. In some embodiments, a feedback current of +Vdd/Rfb is associated with a compensation current of −Vref/Rsw or −Vdd/Rfb. A feedback current of −Vdd/Rfb is associated with a compensation current of +Vref/Rsw or +Vdd/Rfb. In some embodiments, class-D driver circuit 400 is implemented as an integrated circuit (IC) chip. In this case, the switched resistors and feedback resistors can be implemented as integrated resistors on the IC chip. For example, polysilicon resistors can be implemented in an IC chip with well-controlled matching properties.

As described above, the switch resistor Rsw provides the source current, without requiring the amplifier to be modified to operate at higher slew rate. In some embodiments, the magnitude of compensation current as determined by Vref/Rsw is matched to the magnitude of the feedback current Vdd/Rfb. The accuracy of matching is determined by the integrated fabrication process, and is subject to manufacturing tolerance in the fabrication process. For example, in advanced process technologies, the resistor values can be matched to within about 1%. In some embodiments, the power supply to the class-D driver is s12 V, and Vref can be 5 V.

Figure 5:
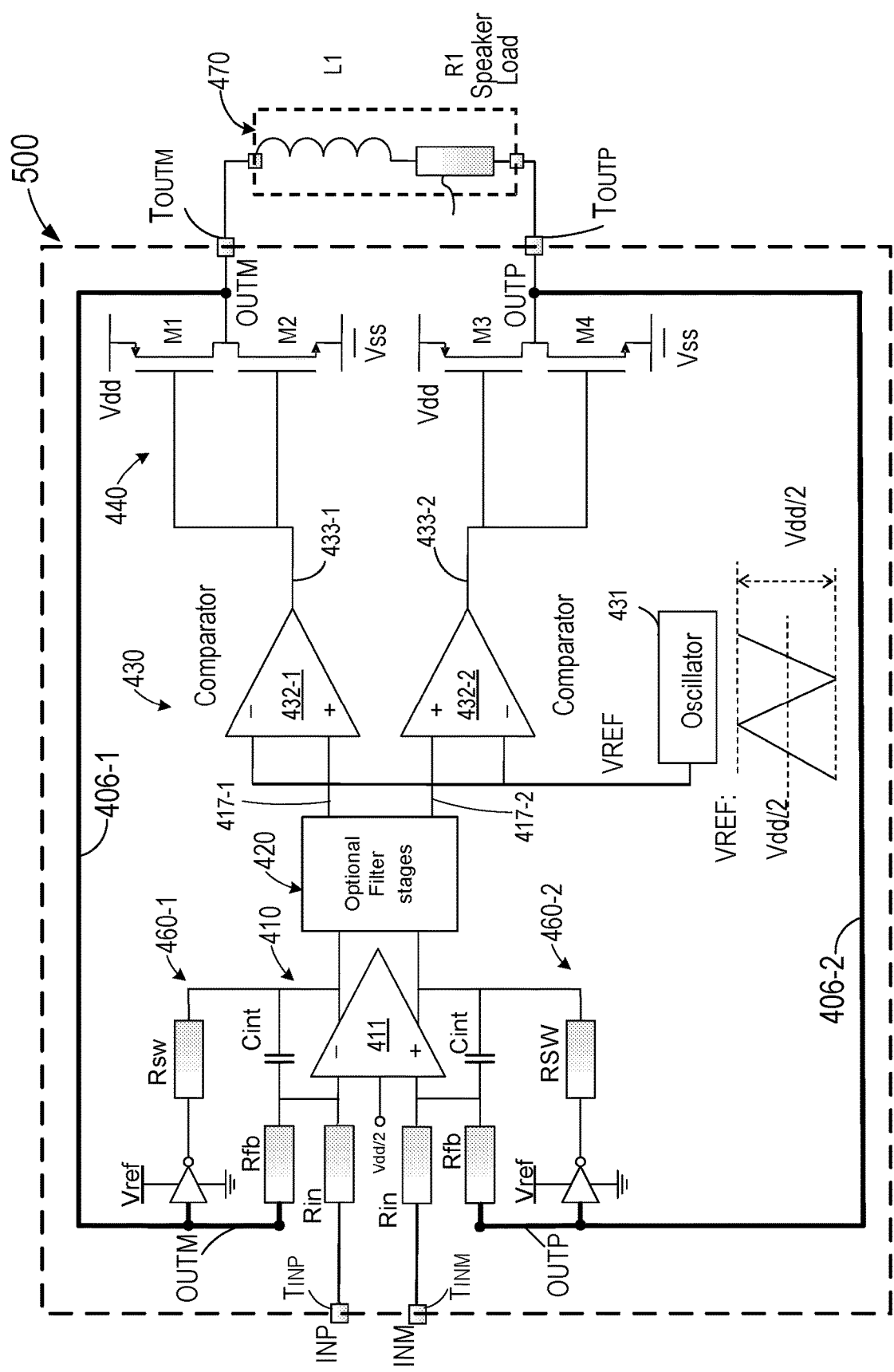
FIG. 5 is a simplified schematic diagram illustrating an implementation of a Class-D driver circuit with a feedback loop and a compensation circuit according to some embodiments of the present invention.

FIG. 5 is a simplified schematic diagram illustrating an implementation of a Class-D driver circuit with a feedback loop and a compensation circuit according to some embodiments of the present invention. As shown in FIG. 5, a class-D driver circuit 500 is similar to class-D driver circuit 400 of FIG. 4, with more detailed implementation provided for a PWM switched modulator stage 430 and a CMOS output driver stage 440. The differential input audio signals INP and INM are input to comparators 432-1 and 432-2, where input signals INP and INM are compared with triangular waves VREF generated from an oscillator 431 to generate PWM signals 433-1 and 433-2. PWM signals 433-1 and 433-2 are coupled to the gates of transistors M1, M2, M3, and M4, respectively. Differential output signals OUTM and OUTP of the class D amplifier are respectively provided at terminals labeled TOUTM and TOUTP.

Figure 6:
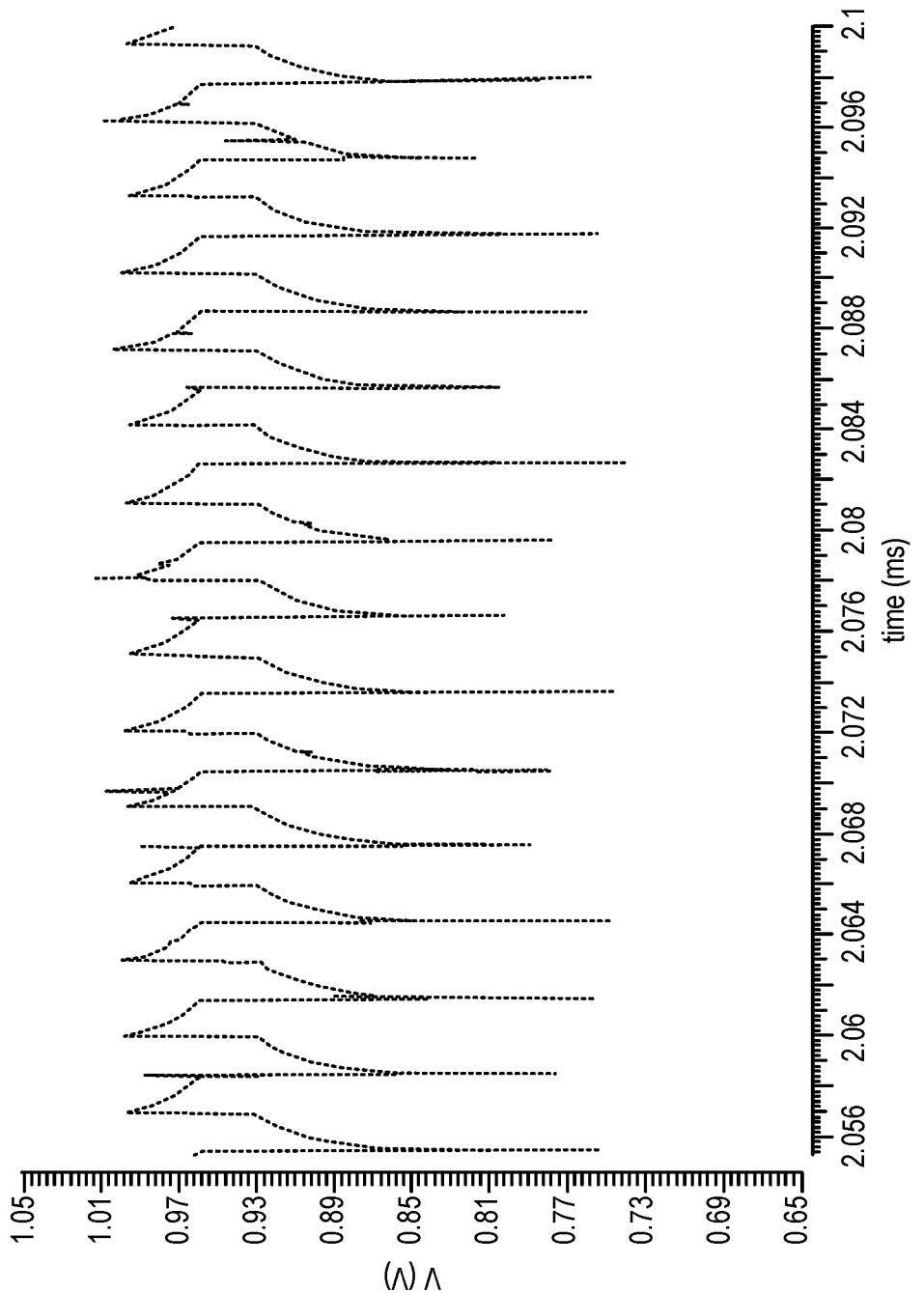
FIG. 6 is a waveform diagram illustrating simulated transient response waveforms of a conventional class-D driver circuit without the compensation circuit described above.
Figure 7:
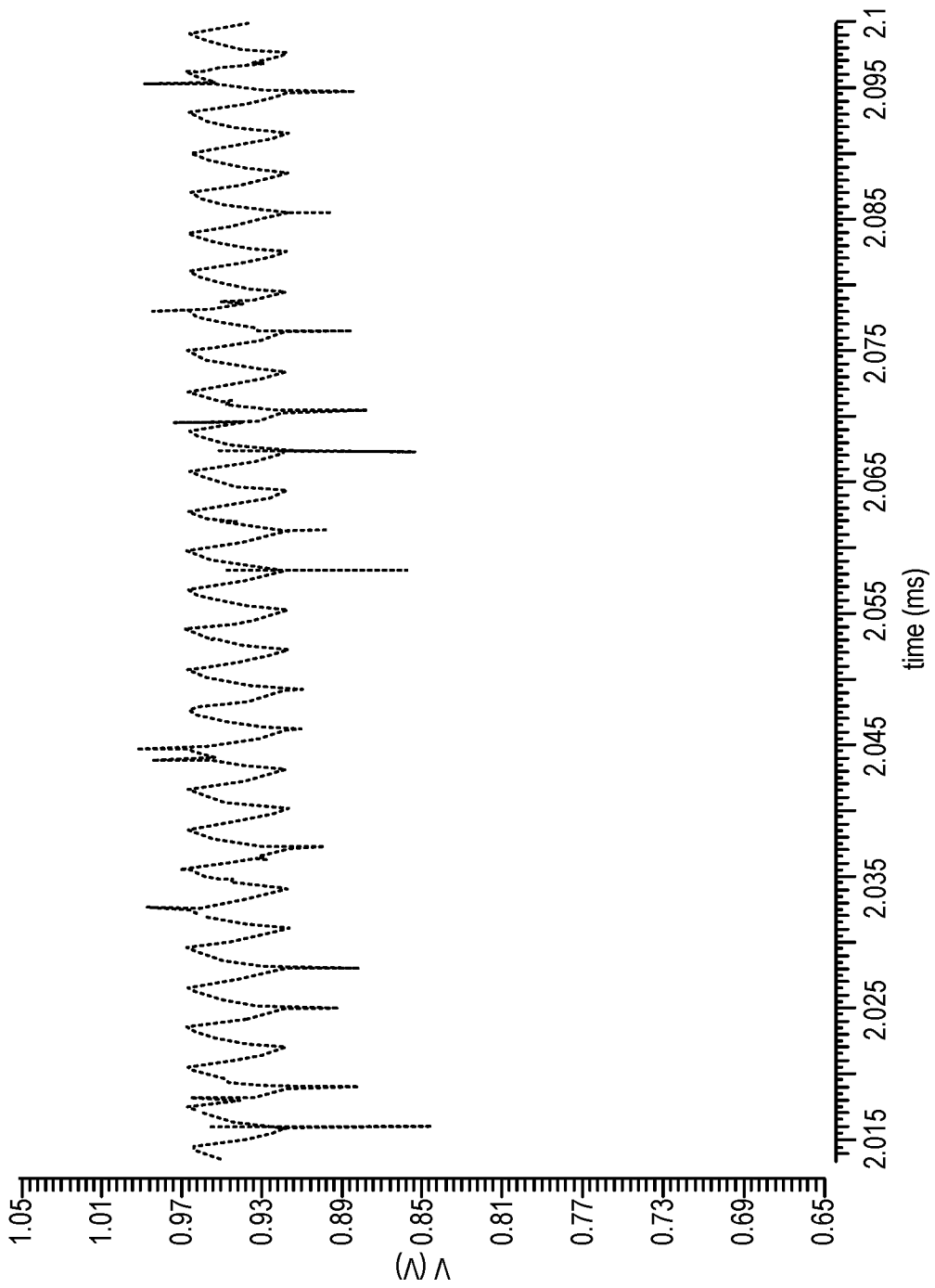
FIG. 7 is a waveform diagram illustrating simulated transient response waveforms of a class-D driver circuit including the compensation circuit according to embodiments of the present invention.

To illustrate the benefit of the compensation circuit described above in connection with FIGS. 4 and 5, a simulation study is carried out to compare a conventional class-D driver circuit without the compensation circuit described above with a class-D driver circuit having the compensation circuit described above in connection with FIG. 4. FIGS. 6 and 7 illustrate gate voltage switching waveforms, and FIG. 8 illustrates performance improvement as measured by total harmonic distortion.

FIG. 6 is a waveform diagram illustrating simulated transient response waveforms of a conventional class-D driver circuit without the compensation circuit described above. The class-D driver circuit studied for FIG. 5 is similar to class-D driver circuit 200 of FIG. 2 and does include an integrator amplifier similar to amplifier 300 illustrated in FIG. 3. In FIG. 5, the vertical axis is the gate voltages Vg2 and Vg3 of transistors Mn2 and Mn3, respectively, of amplifier 300, illustrated in FIG. 3, during the switching operation with a small input signal at about 300 kHz. It can be seen that the gate voltage swings roughly between 0.85V and 1V, a 0.15V difference. Further, there are sharp voltage transitions visible on every cycle. The large voltage swing and sharp transition can degrade performances as measured by, for example, signal noise and Total harmonic distortion (THD).

FIG. 7 is a waveform diagram illustrating simulated transient response waveforms of class-D driver circuit including the compensation circuit according to embodiments of the present invention. The class-D driver circuit studied for FIG. 6 is similar to class-D driver circuit 400 of FIG. 4 and includes an integrator amplifier similar to amplifier 300 illustrated in FIG. 3. In FIG. 6, the vertical axis shows gate voltages Vg2 and Vg3 of transistors Mn2 and Mn3, respectively, of amplifier 300 during the switching operation. It can be seen from FIG. 6 that the gate voltage swings roughly between 0.93V and 0.97V, a 0.04V difference. Compared with the waveforms in FIG. 5, the results in FIG. 6 represent about a 3.5× reduction in magnitude. Note also that the ramp rate on the gate voltages is also less steep. Further, there are only occasional minor sharp voltage transitions visible, indicating that the amplifier outputs are much closer to the ideal target and the amplifier is still in control of the feedback loop.

Figure 8:
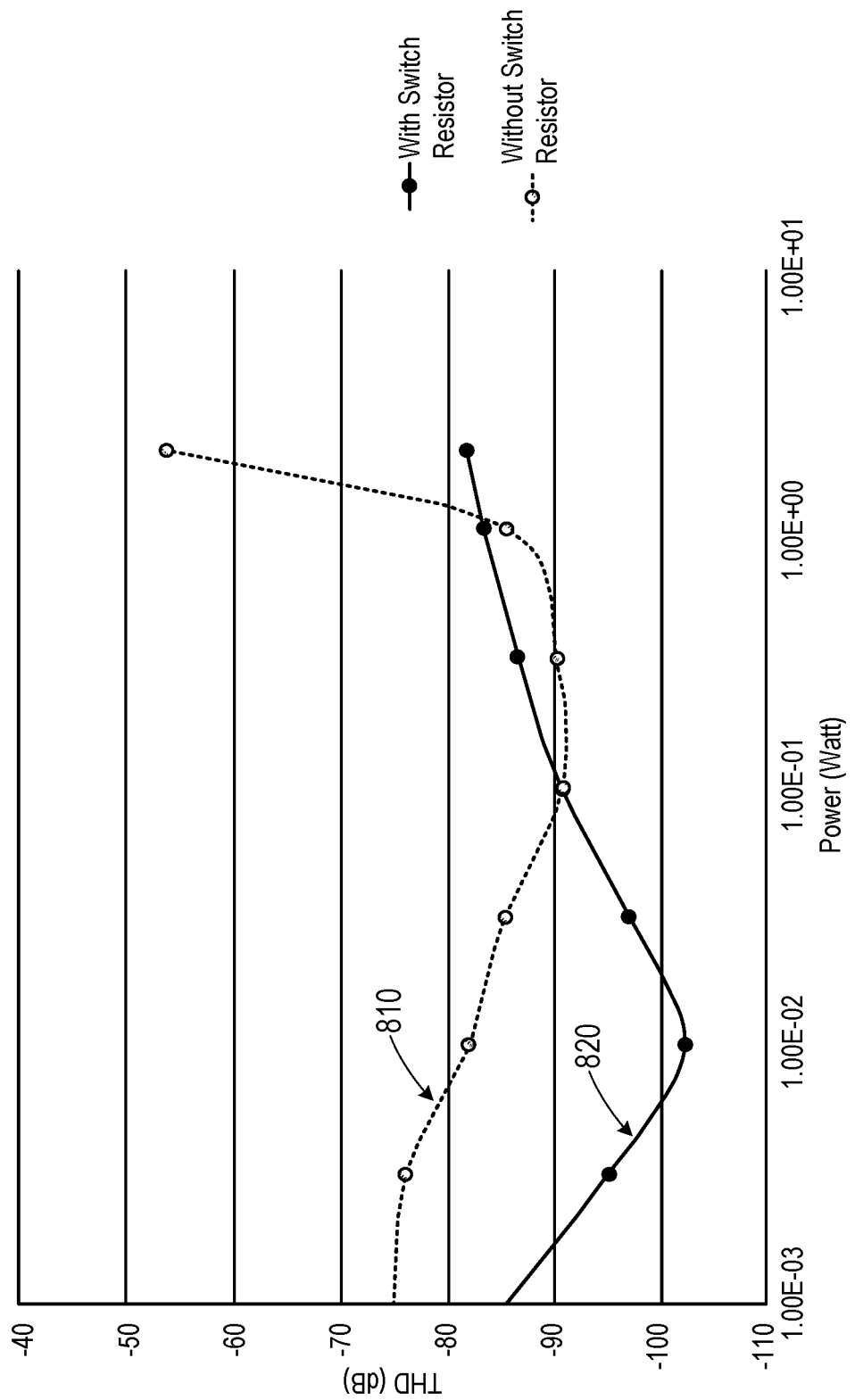
FIG. 8 is a plot of total harmonic distortion (THD) versus power that illustrates performance improvement provided by a compensation circuit according to embodiments of the present invention.

FIG. 8 is a plot of total harmonic distortion (THD) versus power that illustrates performance improvement provided by a compensation circuit according to embodiments of the present invention. In FIG. 8, the vertical axis is the total harmonic distortion, and the horizontal axis is the power. As shown in FIG. 8, 810 illustrates the THD versus power curve for a class-D driver circuit without the switched resistor compensation circuit described above, and 820 illustrates the THD versus power curve for a class-D driver circuit with the switched resistor compensation circuit described above. The simulation was carried out using a 6 kHz input tone. It can be seen that, at below 0.1 Watt, the total harmonic distortion is lower for 820, a class-D driver circuit with the switched resistor compensation circuit, providing up to 10 dB improvements.

FIG. 9 is a simplified flowchart illustrating a method according to some embodiments of the present invention. As shown in FIG. 9, the method 900 includes, at 910, providing a class-D driver circuit having a feedback loop including an input integrator stage, a switched modulator, and an output driver, wherein a feedback resistor connects an output of the output driver with an input node of the input integrator stage to provide a feedback current. Examples of the class-D driver circuit are described above in connection to FIGS. 4-8. For example, in FIG. 4, feedback resistor Rfb connects an output of the output driver stage 440 with an input node 412-1 of the input integrator stage 410 to provide a feedback current 415-1. The method also includes, at 920, providing a compensation current into an output node of the input integrator stage to relieve a slew rate limitation of the feedback loop, the compensation current having a magnitude based on the magnitude of the feedback current. For example, in FIG. 4, compensation current 464-1 feeds into an output node 413-1 of the input integrator stage 410.

In some embodiments of the above method, the compensation circuit includes an inverting buffer and a switched resistor connecting the output of the output driver with an output node of the input integrator stage.

In some embodiments of the above method, the compensation current is determined by Vref/Rsw, wherein Vref is a power supply voltage to the inverter in the compensation circuit, and Rsw is the resistance of the switched resistor. The feedback current is determined by Vdd/Rfb, wherein Vdd is a power supply voltage to the class-D driver circuit, and Rfb is the resistance of the feedback resistor, and Vref/Rsw=Vdd/Rfb. A feedback current of +Vdd/Rfb is associated with a compensation current of −Vref/Rsw or −Vdd/Rfb. A feedback current of −Vdd/Rfb is associated with a compensation current of +Vref/Rsw or +Vdd/Rfb.

In some embodiments of the above method, the compensation circuit is configured to reduce total harmonic distortion (THD) when the class-D driver circuit operates at a higher speed than its designed slew rate.

In some embodiments of the above method, the switched modulator stage comprises a class-D PFM (pulse frequency modulation) modulator stage.

In some embodiments of the above method, the switched modulator stage comprises a class-D PFM (pulse frequency modulation) modulator stage.

In some embodiments of the above method, the input integrator stage further comprises an integration capacitor coupled between the input node and the output node of the input integrator stage.

Although the above embodiments have been described using a selected group of components for an audio driver circuit, there can be many alternatives, modifications, and variations. For example, the driver circuit examples illustrated in FIGS. 4-5 utilize differential circuit designs. However, it is understood that single-ended driver circuits can be implemented using similar circuit structures with transistors and signal polarities adjusted accordingly. Moreover, even though, in the examples described above, the modulated digital pulse signals are pulse width modulation (PWM) signals, it is understood that other forms of modulated digital pulse signals can also be used, for example, pulse frequency modulation (PFM) signals.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A class-D driver circuit, comprising:
an input terminal;
an output terminal;
an input integrator stage having an amplifier with an input node and an output node, the input node coupled to the input terminal through an input resistor to receive an input signal;
a feedback path coupling the input node to the output terminal through a feedback resistor and an integration capacitor to receive a feedback current, the integration capacitor coupled between the input node and the output node of the amplifier, the input integrator stage configured to produce a filtered input signal at the output node;
a switched modulator stage coupled to the input integrator stage and configured for receiving the filtered input signal from the input integrator stage and generating a control signal;
an output driver stage coupled to the switched modulator stage and configured to receive the control signal for driving an output transistor and to provide an output signal at the output terminal; and
a compensation circuit including an inverter and a switched resistor coupled between the output terminal of the class-D driver circuit and the output node of the input integrator stage, wherein the compensation circuit is configured to provide a compensation current whose magnitude matches the magnitude of the feedback current.

2. The circuit of claim 1, wherein:
the compensation current is determined by Vref/Rsw, wherein Vref is a power supply voltage to the inverter in the compensation circuit, and Rsw is the resistance of the switched resistor;
the feedback current is determined by Vdd/Rfb, wherein Vdd is a power supply voltage to the class-D driver circuit, and Rfb is the resistance of the feedback resistor; and $$Vref/Rsw=Vdd/Rfb;$$

wherein:
a feedback current of +Vdd/Rfb is associated with a compensation current of −Vref/Rsw or −Vdd/Rfb; and
a feedback current of −Vdd/Rfb is associated with a compensation current of +Vref/Rsw or +Vdd/Rfb.

3. The circuit of claim 1, wherein the switched modulator stage comprises a class-D PWM (pulse width modulation) modulator stage.

4. The circuit of claim 1, wherein the switched modulator stage comprises a class-D PFM (pulse frequency modulation) modulator stage.

5. A class-D driver circuit, comprising:
a feedback loop including an input integrator stage, a switched modulator, and an output driver stage, wherein a feedback resistor connects an output terminal of the output driver stage with an input node of the input integrator stage to provide a feedback current; and
a compensation circuit configured to provide a compensation current to an output node of the input integrator stage to relieve a slew rate limitation of the feedback loop, the compensation current having a magnitude based on the magnitude of the feedback current.

6. The circuit of claim 5, wherein the compensation circuit includes an inverting buffer and a switched resistor connecting the output of the output driver with an output node of the input integrator stage.

7. The circuit of claim 6, wherein:
the compensation current is determined by Vref/Rsw, wherein Vref is a power supply voltage to the inverter in the compensation circuit, and Rsw is the resistance of the switched resistor;
the feedback current is determined by Vdd/Rfb, wherein Vdd is a power supply voltage to the class-D driver circuit, and Rfb is the resistance of the feedback resistor; and $$Vref/Rsw=Vdd/Rfb;$$

wherein:
a feedback current of +Vdd/Rfb is associated with a compensation current of −Vref/Rsw or −Vdd/Rfb; and
a feedback current of −Vdd/Rfb is associated with a compensation current of +Vref/Rsw or +Vdd/Rfb.

8. The circuit of claim 5, wherein the input integrator stage further comprises an integration capacitor coupled between the input node and the output node of the input integrator stage.

9. The circuit of claim 5, wherein the class-D driver circuit is configured as a differential driver circuit.

10. The circuit of claim 5, wherein the switched modulator stage comprises a class-D PWM (pulse width modulation) modulator stage.

11. The circuit of claim 5, wherein the class-D driver circuit is a differential class-D driver circuit, comprising:
differential input terminals for receiving differential input signals;
differential output terminals for providing differential output signals, which are connected to a load device;
a differential input integrator stage;
a differential PWM modulator stage; and
a differential output driver stage.

12. The circuit of claim 11, wherein:
the feedback loop comprises a first feedback loop and a second feedback loop for providing a first feedback current and a second feedback current, respectively; and
the compensation circuit comprises a first compensation circuit and a second compensation circuit configured to provide a first compensation current and a second compensation current to differential output nodes of the differential input integrator stage.

13. An audio system, comprising the class-D driver circuit of claim 5 and a speaker coupled to the class-D driver circuit to receive an output signal from the output driver stage.

14. A method, comprising:
providing a class-D driver circuit comprising a feedback loop including an input integrator stage, a switched modulator, and an output driver, wherein a feedback resistor connects an output of the output driver with an input node of the input integrator stage to provide a feedback current; and providing a compensation current into an output node of the input integrator stage to relieve a slew rate limitation of the feedback loop, the compensation current having a magnitude based on the magnitude of the feedback current.

15. The method of claim 14, wherein the compensation circuit includes an inverting buffer and a switched resistor connecting the output of the output driver with an output node of the input integrator stage.

16. The method of claim 15, wherein:

the compensation current is determined by Vref/Rsw, wherein Vref is a power supply voltage to the inverter in the compensation circuit, and Rsw is the resistance of the switched resistor;

the feedback current is determined by Vdd/Rfb, wherein Vdd is a power supply voltage to the class-D driver circuit, and Rfb is the resistance of the feedback resistor; and $Vref/Rsw=Vdd/Rfb;$ wherein:

a feedback current of +Vdd/Rfb is associated with a compensation current of −Vref/Rsw or −Vdd/Rfb; and a feedback current of −Vdd/Rfb is associated with a compensation current of +Vref/Rsw or +Vdd/Rfb.

17. The method of claim 14, wherein the compensation circuit is configured to reduce total harmonic distortion (THD) when the class-D driver circuit operates at a higher speed than its designed slew rate.

18. The method of claim 14, wherein the switched modulator stage comprises a class-D PWM (pulse width modulation) modulator stage.

19. The method of claim 14, wherein the switched modulator stage comprises a class-D PFM (pulse frequency modulation) modulator stage.

20. The method of claim 14, wherein the input integrator stage further comprises an integration capacitor coupled between the input node and the output node of the input integrator stage.

* * * * *